US007411430B2

(12) United States Patent
Cheng et al.

(10) Patent No.: US 7,411,430 B2
(45) Date of Patent: Aug. 12, 2008

(54) ANALOG OUTPUT BUFFER CIRCUIT FOR FLAT PANEL DISPLAY

(75) Inventors: Huang-Chung Cheng, Tainan (TW); Ya-Hsiang Tai, Hsinchu (TW); Bo-Ting Chen, Taichung County (TW); Chun-Hsiang Fang, Yilan County (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 24 days.

(21) Appl. No.: 11/306,813

(22) Filed: Jan. 12, 2006

(65) Prior Publication Data

US 2007/0159442 A1 Jul. 12, 2007

(51) Int. Cl.
*H03K 3/00* (2006.01)

(52) U.S. Cl. ...................................... 327/108; 345/100

(58) Field of Classification Search ................. 327/108; 345/100

See application file for complete search history.

(56) References Cited

U.S. PATENT DOCUMENTS 6,243,066 B1 * 6/2001 Murakami et al. ............ 345/98
6,876,235 B2 * 4/2005 Li et al. ...................... 327/112
7,221,194 B2 * 5/2007 Lin et al. .................... 327/108
2004/0178831 A1 9/2004 Li et al. ...................... 327/112

* cited by examiner

*Primary Examiner*—Kenneth B. Wells
(74) *Attorney, Agent, or Firm*—Jianq Chyun IP Office

(57) ABSTRACT

An analog output buffer circuit for a flat panel display is provided for improving an output signal distortion. The circuit includes a transistor, a current source, an input capacitor, an upper switch, a lower switch, a first switch, a second switch and a third switch. In which, the transistor and the current source are electrically connected in series between a first power supply and a second power supply. The current source provides a compensatory current for the transistor when a leakage current occurs. The upper switch and the first switch are turned on during the first period, and the lower switch and the second switch are turn on during the second period, in which the second period is after the first period. Those switches eliminate the drawback of different voltage levels between the input signal and the output signal obtained from the output buffer circuit inputted by the input signal.

6 Claims, 5 Drawing Sheets

ANALOG OUTPUT BUFFER CIRCUIT FOR FLAT PANEL DISPLAY

BACKGROUND OF THE INVENTION

1. Field of the Invention

The present invention relates to an analog output buffer circuit, and particularly to an analog output buffer circuit for a flat panel display.

2. Description of Related Art

Because of being able to integrate a driving circuit and a control circuit to a display panel, low temperature poly-silicon (LTPS) process is widely used in LCD devices. However, comparing to single crystal silicon, a typical LTPS still has some problems to overcome, e.g., low carrier mobility, high cut-off voltage, uneven electrical property of thin film transistors (TFTs) and less stable process, all of which may cause difficulties of circuit integration and circuit design.

Moreover, according to an LTPS LCD panel, the impedance at the signal side is different from that of the panel side. Therefore, direct input of the signals from the signal side to the panel side is likely to cause a signal distortion and an incorrect gray scale in display. Accordingly, an analog output buffer circuit is usually employed between the signal side and the panel side for driving the load of the panel side. The output buffer circuit must display the entire signal inputted by the signal side, and at the same time isolates the signal side and the load of the panel side, thus avoiding the signal distortion of the signal side because of the load variation at the panel side.

Improperly designed output buffer circuits or uneven electrical property of poly-silicon TFTs cause the distortion of the signals outputted from the output buffer circuits. In other words, buffered signals which are different from the original signals transmitted from the signal side will lead to a poor display quality. Therefore, what is needed is to provide an analog output buffer circuit for driving an LTPS display, which can overcome the disadvantage of analog output buffer circuit without stable quality in LTPS manufacturing process.

Referring to FIG. 1, a conventional analog output buffer circuit for a display panel is illustrated. According to FIG. 1, the analog output buffer circuit includes a N-type poly-silicon transistor N10 and a P-type poly-silicon transistor P10 connected in series between a voltage source VDD and a voltage source VSS. An input node IN is electrically connected to a gate of the TFT N10 and a gate of the transistor P10. An output load capacitor CL is electrically connected between an output node OUT and the ground voltage GND. The output node OUT is also electrically connected to a common node of the transistor N10 and the transistor P10. Herein, the capacitance of the output load capacitor CL is the total capacitance of the pixels electrically connected to the output node OUT on the panel.

In operation, an input signal Vin is inputted from an input node IN, and an output signal Vout is outputted from the output node OUT. The input signal Vin and the output signal Vout are illustrated in FIG. 2. It can be known from FIG. 2 that when the input voltage rises from 0 V to 6 V, the output voltage apparently can not rise to 6 V. That means the output signal obtained from the output buffer circuit inputted by the input signal does not have a voltage level same as that of the input signal.

FIG. 3 illustrates another conventional analog output buffer circuit for a display. The major difference between the circuit shown as FIG. 3 and the circuit shown as FIG. 1 is that the circuit shown as FIG. 3 employs an input capacitor C30 and switches S31, S32 and S33 to eliminate the drawback of different voltage levels between the input and the output signals in the circuit shown as FIG. 1. Referring to FIG. 3, as the switches S31 and S33 being turned on, a voltage difference is stored in the input capacitor C30, then the switches S31 and S33 are turned off and the switch S32 is turned on, then the input signal Vin has a voltage difference added at the input capacitor C30, thus the original input signal level is promoted thereby.

However, the transistor N10 is not ideal as a switch, especially when it is turned off. In other words, even the output signal Vout has a promoted voltage level to have the transistor N10 turned off, a leaking current may still flow through and continue charging the output load capacitor CL and therefore make the voltage level of the output signal Vout higher than the voltage level of the input signal Vin. The input signal Vin and the output signal Vout of a circuit shown as FIG. 3 are illustrated in FIG. 4. It can be known from FIG. 3 that a voltage level of the output signal apparently rises with time up to a level over the voltage level of the input signal, which causes an output signal Vout distortion.

SUMMARY OF THE INVENTION

An object of the present invention is to provide an analog output buffer circuit adapted for a flat panel display. The analog output buffer circuit employs a current source for providing a compensatory current to avoid an output signal distortion caused by a leakage current of a transistor. Hence, an electric property variation of the transistor has less affect to the signal transmission, and the circuit can be operated more stably.

Another object of the present invention is to provide an analog output buffer circuit adapted for a flat panel display. The analog output buffer circuit is adapted for promoting an input voltage signal to a given voltage level without using a capacitor for charging. Therefore, an output signal without distortion can be obtained, and the wafer area used can be reduced for lowering production cost.

For achieving the foregoing objects and others, according to an embodiment, the present invention provides an analog output buffer circuit for a flat panel display. The analog output buffer circuit includes a transistor, a current source, an upper switch, a lower switch, a first switch, a second switch, a third switch and an input capacitor. The transistor includes a first source/drain electrically connected to a first voltage source, a second source/drain electrically connected to a circuit output node and a gate electrically connected to a first terminal of the input capacitor. The transistor can be a N-type transistor, e.g., a N-type poly-silicon TFT. The current source is electrically connected between the circuit output node and a second voltage source. When a leakage current occurs, the current source provides a compensatory current for the transistor according to the amplitude of the leakage current for avoiding the leakage current charging an output load capacitor and causing an output voltage distortion. The upper switch is electrically connected between the input node and the first terminal of the input capacitor. The lower switch is electrically connected between the input node and a second terminal of the input capacitor. The first switch is electrically connected between the second terminal of the input capacitor and the circuit output node. The second switch is electrically connected between the circuit output node and an output node. The third switch is electrically connected between the output node and a third voltage source. The analog output buffer circuit has three operating periods in turn. First, in the third period, the third switch is turned on for resetting the system. Second, in the first period, the upper switch and the first switch are turned on for charging the input capacitor. Third, in the second period, the lower switch and the second switch are turned on for using the voltage across the input capacitor to promote the input voltage level.

According to an embodiment of the invention, the flat panel display can be an LCD or an LTPS LCD. The current source, for example, can be implemented by a bias transistor, in which the bias transistor can be a P-type transistor or a P-type poly-silicon TFT. The P-type transistor includes a first source/drain electrically connected to the circuit output node, a second source/drain electrically connected to the second voltage source and a gate electrically connected to a bias voltage source. The amplitude of a current flowing through the P-type transistor can be controlled by adjusting the voltage provided by the bias voltage source.

For achieving the objects and others, according to an embodiment, the present invention provides another analog output buffer circuit for a flat panel display. The analog output buffer circuit includes a first transistor, a second transistor, a first input transistor and a second input transistor. The first transistor includes a first source/drain electrically connected to a first voltage source, a second source/drain electrically connected to an output node and a gate electrically connected to a circuit input node. The second transistor includes a first source/drain electrically connected to the output node, a second source/drain electrically connected to a second voltage source and a gate electrically connected to the circuit input node. The first input transistor includes a first source/drain electrically connected to an input node, a second source/drain electrically connected to the circuit input node and a gate electrically connected to the input node. The second input transistor includes a first source/drain electrically connected to the circuit input node, a second source/drain electrically connected to and the input node and a gate electrically connected to the circuit input node.

In an embodiment, the first input transistor and second input transistor can be N-type transistors, e.g., N-type poly-silicon TFTs. In an embodiment, the second transistor can be a P-type transistor, e.g., a P-type poly-silicon TFT. In an embodiment, the flat panel display can be an LCD or an LTPS LCD.

The present invention solves the problem of output signal distortion caused by a leakage current of a transistor by employing a current source. Therefore, even though the electric property of the transistor may vary a lot, the circuit can be kept in an optimum operating condition by adjusting the current amplitude of the current source with an external bias voltage. As a result, the stability of the circuit is improved and correct signals can be inputted to the display panel. Moreover, the present invention uses the design having electrically connected transistors in parallel to replace the conventional circuit design which uses a capacitor to store charges in order to promote the voltage level of the output signal. Thus, the wafer area used can be reduced and the production cost can be saved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
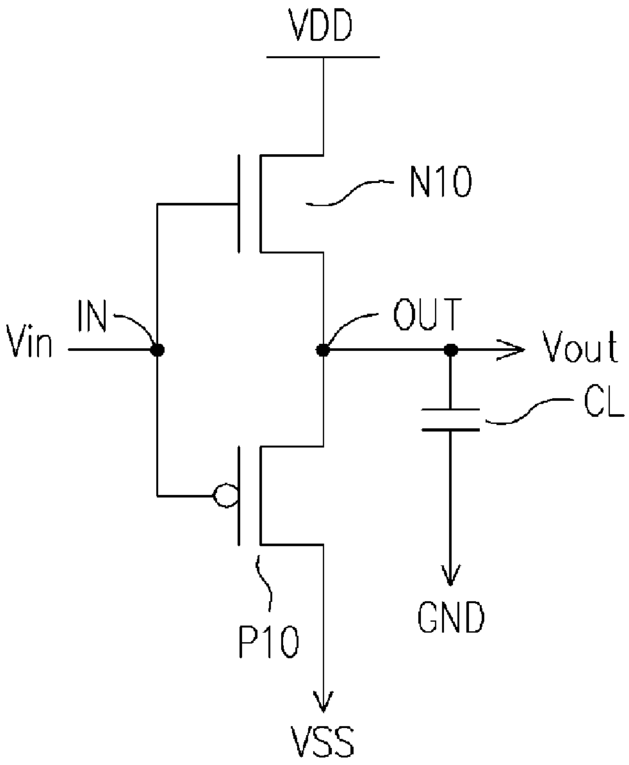
FIG. 1 (PRIOR ART)
FIG. 1 is a circuit diagram of a conventional analog output buffer circuit for a display panel.

Reference will now be made in detail to the present preferred embodiments of the invention, examples of which are illustrated in the accompanying drawings. Wherever possible, the same reference numbers are used in the drawings and the description to refer to the same or like parts.

Figure 5:
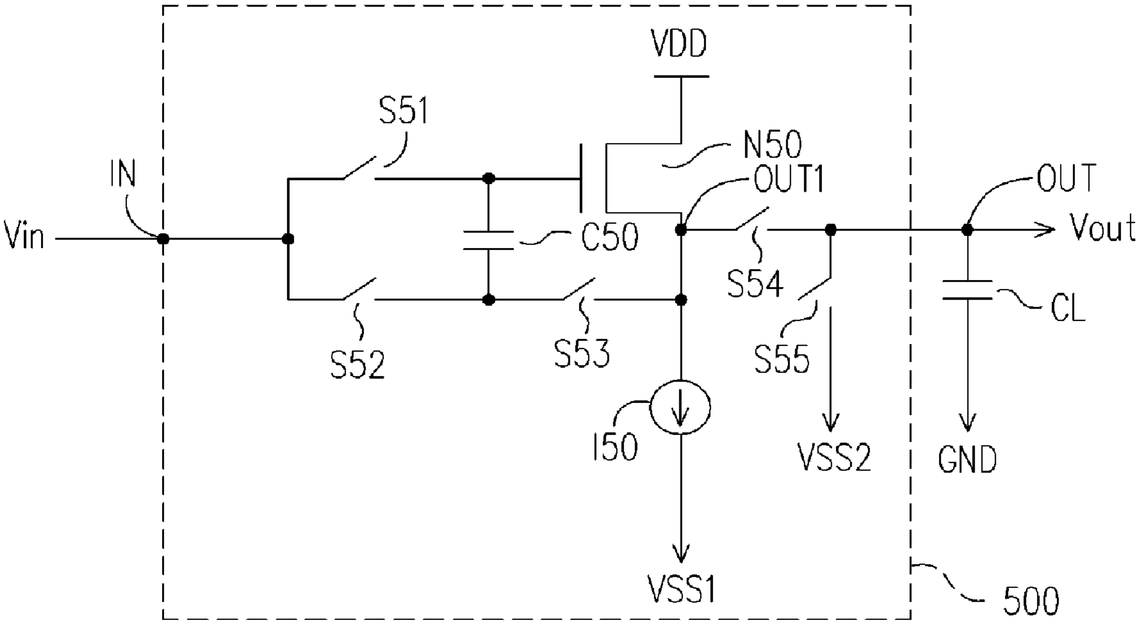
FIG. 5 is a circuit diagram of an analog output buffer circuit for a display panel according to an embodiment of the invention.

FIG. 5 is a circuit diagram of an analog output buffer circuit 500 for a display panel according to an embodiment of the invention. Referring to FIG. 5, the analog output buffer circuit 500 includes a N-type poly-silicon transistor N50 (indicated as TFT N50 here below), an input capacitor C50, a current source I50, an upper switch S51, a lower switch S52, a first switch S53, a second switch S54 and a third switch S55. As using for an LTPS LCD, the analog output buffer circuit 500 is adapted for driving a pixel capacitor (represented herein as an output load capacitor CL) of a display panel to which the circuit 500 is electrically connected.

The transistor N50 includes a first source/drain electrically connected to a first voltage source VDD; a second source/drain electrically connected to a circuit output node OUT1; and a gate electrically connected to a first terminal of the input capacitor C50. The current source I50 is electrically connected between the circuit output node OUT1 and a second voltage source VSS1. When a leakage current occurs, the current source I50 provides a compensatory current for the transistor N50 according to the amplitude of the leakage current for avoiding the leakage current charging the output load capacitor CL and causing an output signal distortion. If there is no leakage current at the transistor N50, the current source I50 provides a current needed by the circuit only and does not provide a compensatory current. The leakage current at the transistor N50 can be resulted from an element having electrical property variation, a process problem or an unclosed channel of the transistor N50 operating at the triode region.

The upper switch S51 is electrically connected between an input node IN and a first terminal of the input capacitor C50. The lower switch S52 is electrically connected between the input node IN and a second terminal of the input capacitor C50. The first switch S53 is electrically connected between the second terminal of the input capacitor C50 and the circuit output node OUT1. The second switch S54 is electrically connected between the circuit output node OUT1 and an output node OUT. The third switch S55 is electrically connected between the output node OUT and a third voltage source VSS2. The voltage sources VSS1 and VSS2, for example, are ground voltage or negative voltage.

According to an embodiment of the invention, the switches S51, S52, S53, S54 and S55 of the analog output buffer circuit 500 have three operating periods in turn—the third period T3, the first period T1 and the second period T2 in sequence. The three periods are not overlapped each other. The times they last and the times they start are also respectively different from each other. For example, the periods T1~T3 can be adjusted as shown in FIG. 7.

Figure 7:
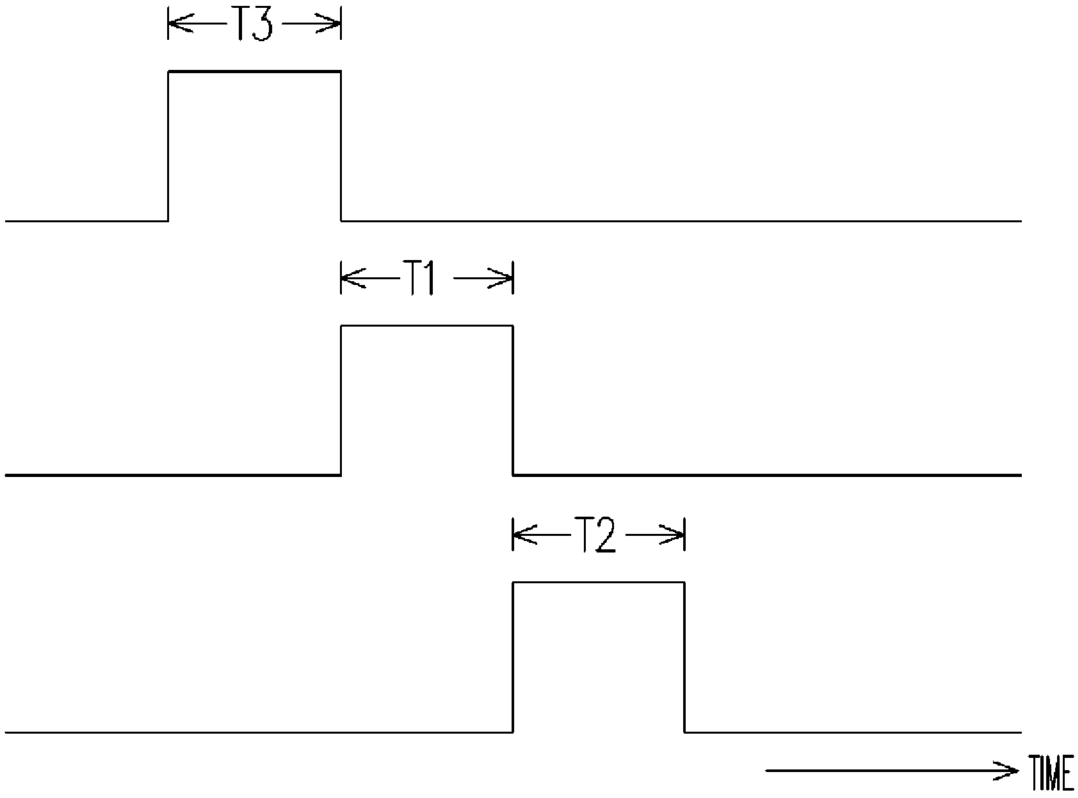
FIG. 7 is a timing sequence diagram of the switches of the circuit shown as FIG. 5.

FIG. 7 is a timing sequence diagram of the switches S51, S52 and S53 of the circuit shown as FIG. 5. Referring to FIG. 7, at the beginning, all switches S51, S52 and S53 are turned off. In the third period T3, the third switch S55 is turned on and the rest are kept off to have signals of the load capacitor reset. Then, in the first period T1, the upper switch S51 and the first switch S53 are turned on and the rest are turned off, so that an input signal Vin is inputted from the input node IN, the input signal flows through a path composed of the upper switch S51, the input capacitor C50, the first switch S53 and the current source I50 to charge the input capacitor C50 and applies a voltage difference between the first terminal and the second terminal thereof. According to an embodiment of the invention, the voltage difference applied to the input capacitor C50 is designed as a threshold voltage of the transistor N50. Then, in the second period T2, the lower switch S52 and the second switch S54 are turned on and the rest are kept off, an input signal that is equal to the input signal Vin plus the threshold voltage of the transistor N50 is obtained at the gate of the transistor N50. Therefore, distortion of the output signal Vout and the input signal Vin caused by the threshold voltage of the transistor N50 can be eliminated.

Figure 4:
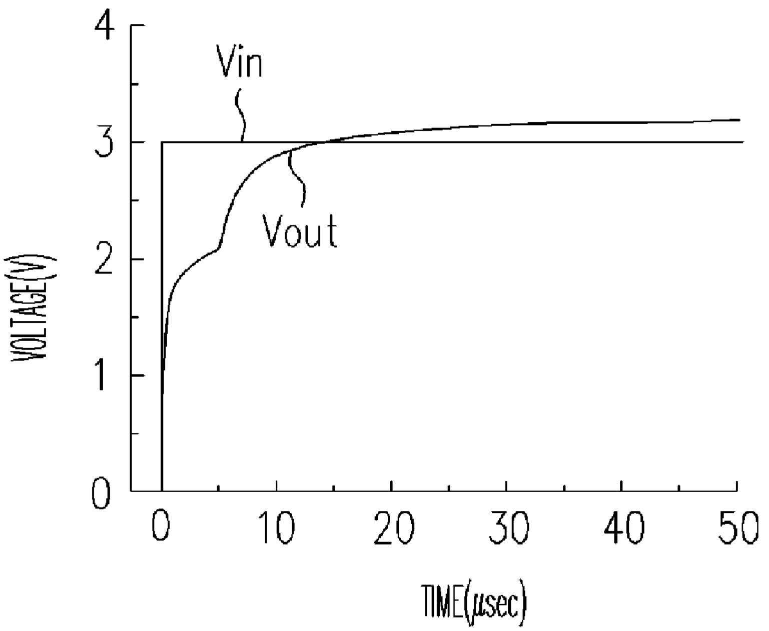
FIG. 4 (PRIOR ART)
FIG. 4 is a waveform diagram illustrating the input signal and the output signal of the circuit shown as FIG. 3.
Figure 6:
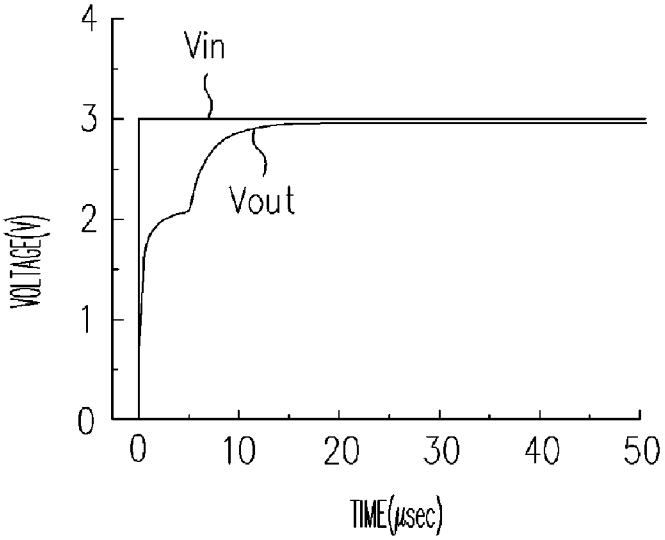
FIG. 6 is a waveform diagram illustrating the input signal and the output signal of the circuit shown as FIG. 5.

FIG. 6 is a waveform diagram illustrating the input signal Vin and the output signal Vout of the circuit shown as FIG. 5. Referring to FIG. 6 and FIG. 4 together, it can be known that the present embodiment differs from that of FIG. 4. The present embodiment eliminates a voltage difference between the output signal Vout and the input signal Vin, which is usually existed in the conventional analog output buffer circuit. In other words, the output signal Vout will not gradually rise with time, in that the current source I50 prevents the leakage current from keeping charging to the output load capacitor CL.

It is to be noted that the current source I50 can be implemented in many manners. The current source I50, for example, can be implemented by a bias transistor, in which the bias transistor can be a P-type poly-silicon TFT (indicated as P-type transistor hereinafter). The P-type transistor includes a first source/drain electrically connected to the circuit output node OUT1, a second source/drain electrically connected to the second current source VSS1, and a gate electrically connected to a bias voltage source. The amplitude of a current flowing through the P-type transistor can be controlled by adjusting the voltage provided by the bias voltage source. And therefore, the operating current and the compensatory current for the transistor N50 can be provided thereby. Those skilled in the art should understand that the current source I50 can be substituted by a combination of a transistor incorporating with a control voltage or other current source circuits within the scope of the present invention.

Figure 8:
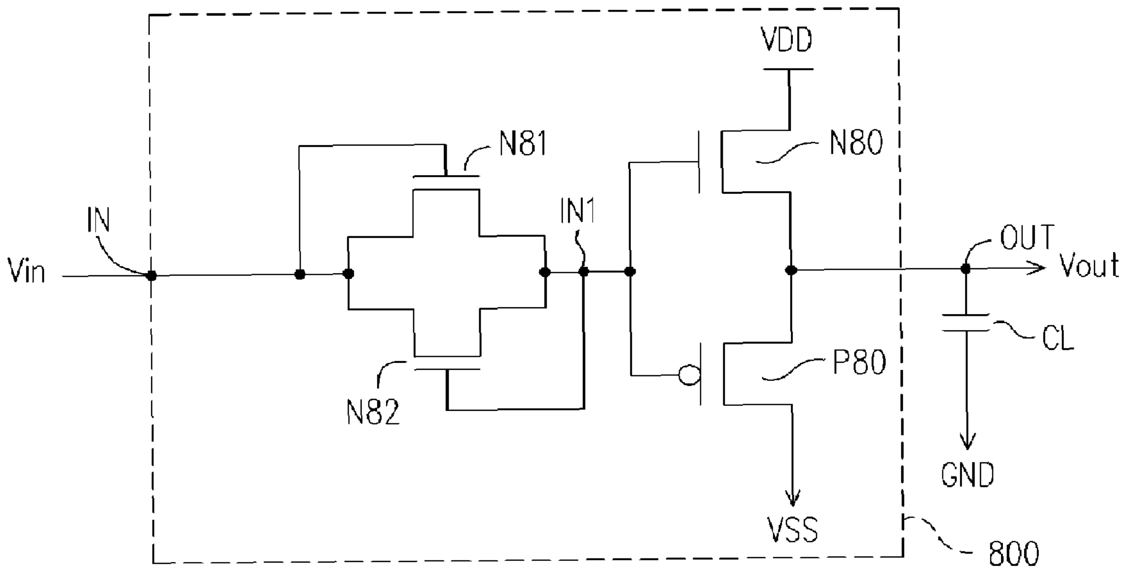
FIG. 8 is a circuit diagram of an analog output buffer circuit for a display panel according to another embodiment of the invention.

FIG. 8 is a circuit diagram of an analog output buffer circuit 800 for a display panel according to another embodiment of the invention. Referring to FIG. 8, the analog output buffer circuit 800 includes a first transistor N80, a second transistor P80, a first input transistor N81 and a second input transistor N82. As using for an LTPS LCD, the analog output buffer circuit 800 is adapted for driving a pixel capacitor (represented herein as an output load capacitor CL) of a display panel to which the circuit 800 is electrically connected. According to the embodiment, the first transistor N80, the first input transistor N 81 and the second input transistor N82 are all N-type poly-silicon TFTs, and the second transistor P80 is a P-type TFT.

According to the embodiment, the first transistor N80 includes a first source/drain and a second source/drain electrically connected to a first voltage source VDD and an output node OUT respectively; and a gate electrically connected to a circuit input node IN1. The second transistor P80 includes a first source/drain and a second source/drain electrically connected to an output node OUT and a second voltage source VSS respectively; and a gate electrically connected to the circuit input node IN1. The first input transistor N81 includes a first source/drain and a second source/drain electrically connected to an input node IN and a circuit input node IN1 respectively; and a gate electrically connected to the input node. The second input transistor N82 includes a first source/drain and a second source/drain electrically connected to the circuit input node IN1 and the input node IN respectively; and a gate electrically connected to the circuit input node IN1. The input node IN is electrically connected for receiving an input signal Vin and the output node OUT is electrically connected for output an output signal Vout.

If at the beginning, the output load capacitor CL is reset by turning off the first transistor N80 and turning on the second transistor P80, in that the output node OUT has a low voltage level, therefore because the first source/drain and the gate of the first transistor N81 are connected to compose a diode structure, the voltage level of the circuit input node IN1 is equal to Vin−Vth1, wherein Vth1 is a threshold voltage of the first input transistor N81. Then, when the input signal Vin rises to a voltage level at which the voltage level of the circuit input node IN1 that is Vin−Vth1 can turn on the first transistor N80, the first transistor has a current flowing through and starts to charge the output load capacitor CL and therefore gradually promote the voltage of the output signal Vout (that is, the voltage of the circuit input node IN1 is promoted). Meanwhile, the second input transistor N82 begin to have a sub-threshold current flowing through till the voltage level of the circuit input node IN1 rises to Vin+Vth2, wherein Vth2 is a threshold voltage of the second input transistor N82. Therefore, at this time, the voltage level of the output signal Vout is equal to Vin+Vth2−Vth0, wherein Vth0 is a threshold voltage of the first transistor N80.

If the second input transistor N82 and the first transistor N80 are designed to be very close to each other on the panel, the threshold voltages of the two are substantially equivalent (Vth2=Vth0). In other words, the voltage of the output signal Vout is substantially equal to the voltage of the input signal Vin (Vout=Vin).

Figure 2:
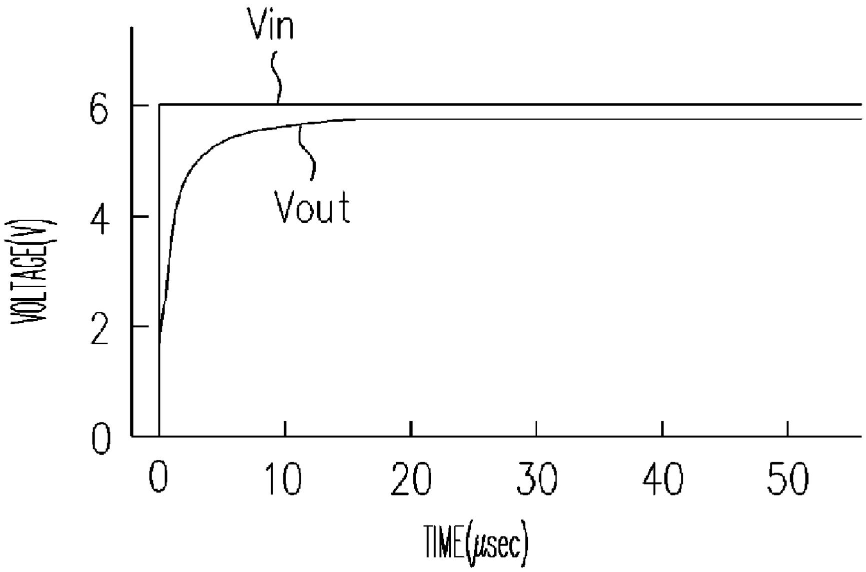
FIG. 2 (PRIOR ART)
FIG. 2 is a waveform diagram illustrating the input signal and the output signal of the circuit shown as FIG. 1.
Figure 3:
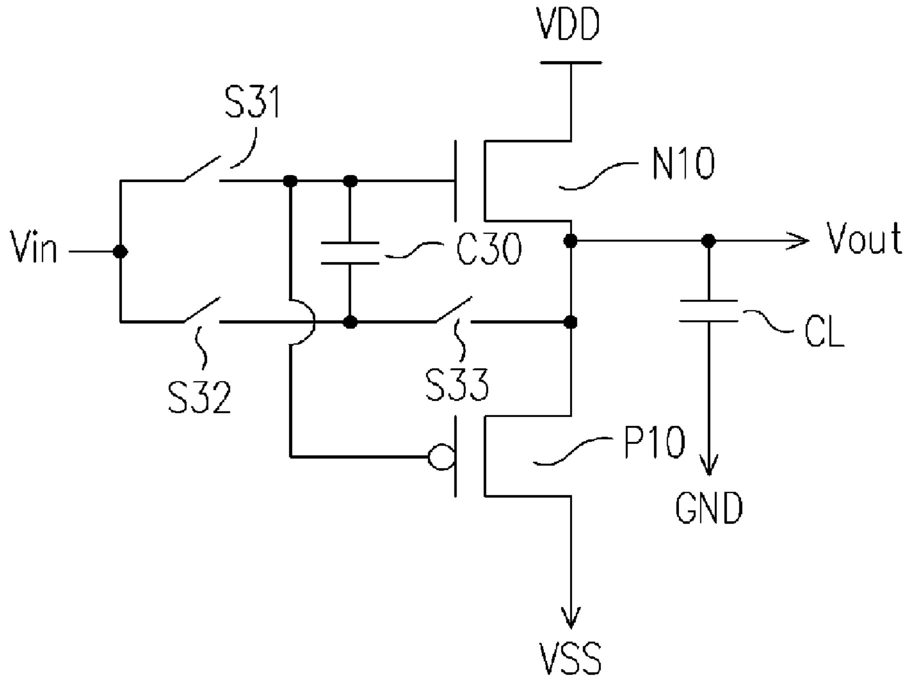
FIG. 3 (PRIOR ART)
FIG. 3 is a circuit diagram of another conventional analog output buffer circuit for a display panel.
Figure 9:
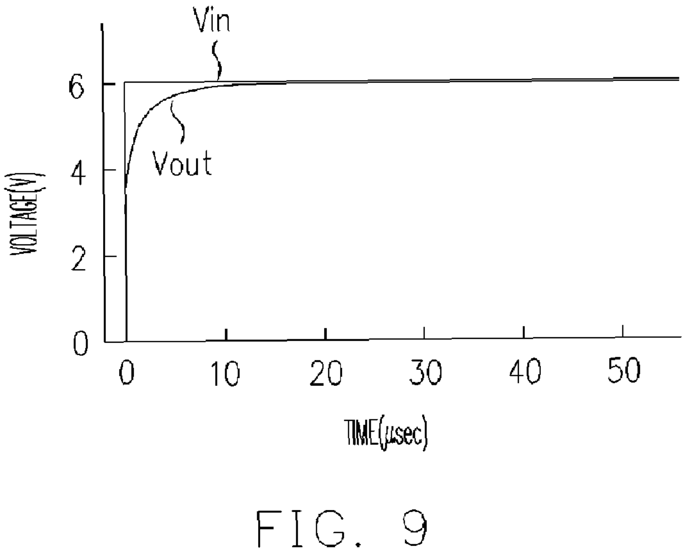
FIG. 9 is a waveform diagram illustrating the input signal and the output signal of the circuit shown as FIG. 8.

FIG. 9 is a waveform diagram illustrating the input signal and the output signal of the circuit shown as FIG. 8. Referring to FIG. 9, comparing with the waveform diagram shown as FIG. 2, it apparently shows that the voltage difference between the input signal Vin and the output signal Vout is distinctly improved, and the signal distortions of the input signal Vin and the output signal Vout are obviously calibrated.

According to the foregoing embodiments, the present invention employs a current source for providing a compensatory current to avoid an output signal distortion caused by a leakage current of a transistor. In addition, the affect to the circuit caused by electric property variations due to a poly-silicon process can also be eliminated. Furthermore, according to another embodiment, the present invention employs a newly designed circuit without using a capacitor for calibrating the input signals, thus the wafer area used thereby can be reduced and the production cost can be effectively lowered.

Other modifications and adaptations of the above-described preferred embodiments of the present invention may be made to meet particular requirements. This disclosure is intended to exemplify the invention without limiting its scope. All modifications that incorporate the invention disclosed in the preferred embodiment are to be construed as coming within the scope of the appended claims or the range of equivalents to which the claims are entitled.

What is claimed is:

1. An analog output buffer circuit for a flat panel display, the analog output buffer circuit comprising:

a transistor, comprising a first source/drain directly connected to a first voltage source for receiving the first voltage source continuously, a second source/drain electrically connected to a circuit output node and a gate electrically connected to a first terminal of an input capacitor;

a current source, electrically connected between the circuit output node and a second voltage source, for providing a compensatory current for the transistor when a leakage current occurs;

an upper switch, electrically connected between an input node and the first terminal of the input capacitor, the upper switch being turned on in a first period;

a lower switch, electrically connected between the input node and a second terminal of the input capacitor, the lower switch being turned on in a second period;

a first switch, electrically connected between the second terminal of the input capacitor and the circuit output node, the first switch being turned on in the first period; and a second switch, electrically connected between the circuit output node and an output node, the second switch being turned on in a second period, wherein the second period is after the first period in sequence, and a current provided by the current source remains unchanged with an operation of the upper switch and the lower switch.

2. The analog output buffer circuit according to claim 1, wherein the flat panel display comprises a liquid crystal display.

3. The analog output buffer circuit according to claim 1, wherein the flat panel display comprises a low temperature poly-silicon liquid crystal display.

4. The analog output buffer circuit according to claim 1, wherein the transistor comprises an N-type transistor.

5. The analog output buffer circuit according to claim 4, wherein the N-type transistor comprises an N-type poly-silicon thin film transistor.

6. The analog output buffer circuit according to claim 1, further comprising:

a third switch, electrically connected between the output node and a third voltage source, the third switch being turned on in the third period, wherein the third period is prior to the first period in sequence.

* * * * *